(12) United States Patent
Kim

(10) Patent No.: US 7,791,115 B2
(45) Date of Patent: Sep. 7, 2010

(54) ORGANIC LIGHT EMITTING DISPLAY DEVICE

(75) Inventor: Eunah Kim, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 573 days.

(21) Appl. No.: 11/592,855

(22) Filed: Nov. 3, 2006

(65) Prior Publication Data
US 2007/0120157 A1 May 31, 2007

(30) Foreign Application Priority Data
Nov. 29, 2005 (KR) .................. 10-2005-0115109
Nov. 29, 2005 (KR) .................. 10-2005-0115110
Dec. 14, 2005 (KR) .................. 10-2005-0123215

(51) Int. Cl.
*H01L 31/062* (2006.01)
*H01L 31/113* (2006.01)

(52) U.S. Cl. ............ 257/291; 257/59; 257/72; 313/500; 313/503; 313/504; 313/506; 313/512; 439/69; 439/56; 439/58; 439/59; 439/110; 439/153; 439/158; 445/24; 445/25; 345/36; 345/38; 345/44; 345/45; 345/46; 345/87

(58) Field of Classification Search ............ 313/500, 313/503, 504, 506, 512; 439/69, 56, 58, 439/59, 110, 153, 158, FOR. 124, FOR. 125; 445/24, 25; 257/59, 72, 291; 345/36, 38, 345/44–46, 87

See application file for complete search history.

(56) References Cited

U.S. PATENT DOCUMENTS

2006/0012732 A1* 1/2006 Kim ...................... 349/69

FOREIGN PATENT DOCUMENTS

KR 10-2004-0093545 A 11/2004
KR 10-2004-0111075 A 12/2004

* cited by examiner

*Primary Examiner*—Lynne A Gurley
*Assistant Examiner*—Meiya Li
(74) *Attorney, Agent, or Firm*—Knobbe Martens Olson & Bear LLP

(57) ABSTRACT

Disclosed is an organic light emitting display, which includes a large quantity of a hydroscopic layer having a good hydroscopic ability by changing a mounting structure of the hydroscopic layer. An organic light emitting display includes a first substrate. An organic emission portion is formed at one surface of the first substrate. A second substrate is formed at a surface of the first substrate on which the organic emission portion is formed for sealing the organic emission portion from external air. A first hydroscopic layer is formed between the first and second substrates. A third substrate is formed at another surface of the first substrate for sealing the first substrate. A second hydroscopic layer is formed between the first and third substrates.

18 Claims, 4 Drawing Sheets

ORGANIC LIGHT EMITTING DISPLAY DEVICE

CROSS-REFERENCE TO RELATED APPLICATIONS

This application claims the benefit of Korean Patent Application Nos. 2005-0115110, filed Nov. 29, 2005, 2005-0115109, filed Nov. 29, 2005, and 2005-0123215, filed Dec. 14, 2005 in the Korean Intellectual Property Office, which are incorporated herein by reference in their entirety.

BACKGROUND

1. Field of the Invention

The present invention relates to information display devices, and more particular to organic light emitting display devices.

2. Discussion of Related Art

Organic light emitting display is a kind of flat panel displays, which emits light emits energy as light wherein excited molecules generated by combined holes and electrons return to a base state to emit the energy by applying a voltage to two electrodes facing each other in a state that an organic emission layer is disposed between the two electrodes to combine holes and electrons injected from respective electrodes to an organic emission layer.

The organic light emitting display having such a light emitting principle has excellent light-emission, a wide angle of visibility, can be light-weighted and slimmed, and can operate in low voltage have been proposed as the next-generation planar type display devices. However, since an organic emission layer of the aforementioned organic light emitting display is susceptible to moisture, a sealing structure for protecting the organic emission layer is required.

In the organic light emitting display technology, a use of a desiccant or hydroscopic layer having a good desiccative or hydroscopic ability is on the rise as a subject to be solved. Consequently, various materials of the desiccant layer or a change of a mounting structure will be studied.

The foregoing discussion is only to provide background information and does not constitute an admission of prior art.

SUMMARY

One aspect of the invention provides an organic light emitting display device, which may comprise: a first substrate; a second substrate; a third substrate, wherein the first substrate is interposed between the second and third substrates; an array of organic light emitting pixels, the array being interposed between the first substrate and the second substrate; a first seal interconnecting the first and second substrates, wherein the first substrate, the second substrate and the first seal in combination define a first enclosed space where the array is located; and a second seal connecting the third substrate to at least of one the first and second substrates (the first substrate, the second substrate, or both of the first and second substrates), wherein the second substrate, the third substrate and the second seal in combination define a second enclosed space.

In the foregoing device, the second substrate may comprise a portion substantially parallel to the first substrate, and wherein the third substrate may comprise a portion substantially parallel to the first substrate. The second substrate may comprise a center portion substantially opposing the first substrate and a peripheral portion surrounding the center portion, wherein the peripheral portion may comprise a first sealing surface, and wherein the first seal may be formed between the first sealing surface and the first substrate. The peripheral portion further may comprise a second sealing surface, and wherein the second seal may be formed between the second sealing surface and the third substrate. The first and second sealing surfaces may be generally parallel or generally perpendicular to each other. The d first and second sealing surfaces may be generally in a single plane.

Still in the foregoing device, the first substrate may comprise a sealing surface, and wherein the first seal may be formed between the first sealing surface of the second substrate and the sealing surface of the first substrate. The first substrate may comprise another sealing surface, and wherein the second seal may be formed between the third substrate and the other sealing surface of the first substrate. The second substrate may comprise a center portion and a peripheral portion surrounding the center portion, wherein the center portion may comprise an inner surface facing the first substrate, and wherein the inner surface may be recessed with reference to the first sealing surface of the peripheral portion. The peripheral portion of the second substrate may comprise a groove, wherein the first substrate may comprise a center portion and a peripheral portion, and wherein at least part of the peripheral portion of the first substrate may be inserted in the groove and engaged with the second substrate.

Further in the foregoing device, the third substrate may comprise a center portion and a peripheral portion surrounding the center portion, wherein the peripheral portion may be integrated with the center portion and extends generally in a direction toward the second substrate, wherein the peripheral portion of the third substrate may comprise a sealing surface, and wherein the second seal interconnects the sealing surface of the third substrate and the second sealing surface of the second substrate. The second substrate may comprise a second sealing surface generally facing away from the first substrate, wherein the third substrate may further comprise a flange extending from the peripheral portion, and wherein the flange may comprise the sealing surface of the third substrate. The peripheral portion surrounds the first substrate and at least part of the second substrate, wherein the peripheral portion may comprise an inner surface facing the first substrate and the at least part of the second substrate, and wherein the inner surface may comprise the sealing surface of the third substrate. The second sealing surface of the second substrate faces the inner surface of the peripheral portion.

Still further in foregoing device, the second substrate may further comprise a flange extending from the peripheral portion, and wherein the flange may comprise a second sealing surface generally facing the third substrate. The device may further comprise a desiccant layer within the first enclosed space, wherein the desiccant layer may be substantially transparent with regard to visible light. The desiccant layer may be interposed between the first substrate and the center portion of the second substrate. The device of may further comprise a desiccant layer within the second enclosed space, wherein the desiccant layer may be opaque with regard to visible light. The desiccant layer contacts at least one of the first and third substrates. The at least part of the third substrate may be made of a material selected from the group consisting of glass, a polymeric resin and a metal.

An aspect of the present invention provides an organic light emitting display, which includes a large quantity of a desiccant layer having a good hydroscopic ability by changing a mounting structure of the desiccant layer.

Another aspect of the present invention provides an organic light emitting display, which has a hydroscopic ability without reducing an area of an emission region and without requiring additional brackets.

The foregoing and/or other aspects of the present invention are achieved by providing an organic light emitting display comprising: a first substrate; an organic emission portion formed at one surface of the first substrate; a second substrate formed at a surface of the first substrate on which the organic emission portion is formed for sealing the organic emission portion from external air; a first desiccant layer formed between the first and second substrates; a third substrate formed at another surface of the first substrate for sealing the first substrate; and a second desiccant layer formed between the first and third substrates.

According to a second aspect of the present invention, there is provided an organic light emitting display comprising: a first substrate; an organic emission portion formed at one surface of the first substrate; a second substrate formed at a surface of the first substrate on which the organic emission portion is formed for sealing the organic emission portion from external air, the second substrate including an extension portion extending to an outer side the surface of the first substrate, and an area of the second substrate being greater than that of the first substrate; a first desiccant layer formed between the first and second substrates; a third substrate formed at another surface of the first substrate, a bend end of the third substrate engaging with a lower surface of the extension portion of the second substrate, for sealing the first substrate; and a second desiccant layer formed between the first and third substrates.

According to a third aspect of the present invention, there is provided an organic light emitting display comprising: a first substrate; an organic emission portion formed at one surface of the first substrate; a second substrate formed at a surface of the first substrate on which the organic emission portion is formed and having the same size as that of the first substrate for sealing the organic emission portion from external air; a first desiccant layer formed between the first and second substrates; a third substrate formed at another surface of the first substrate, a bend end of the third substrate engaging with a side surface of the second substrate, for sealing the first substrate; and a second desiccant layer formed between the first and third substrates.

According to a fourth aspect of the present invention, there is provided an organic light emitting display comprising: a first substrate; an organic emission portion formed at one surface of the first substrate; a second substrate formed at a surface of the first substrate on which the organic emission portion is formed and having the same size as that of the first substrate for sealing the organic emission portion from external air; a first desiccant layer formed between the first and second substrates; a third substrate formed at another surface of the first substrate, a bend end of the third substrate engaging with a upper surface of the second substrate, for sealing the first substrate; and a second desiccant layer formed between the first and third substrates.

According to a fifth aspect of the present invention, there is provided an organic light emitting display comprising: a first substrate; an organic emission portion formed at a surface of the first substrate; a second substrate of a transparent material formed at a surface side of the first substrate on which the organic emission portion is formed, an inward extended and bent edge thereof engaging with another surface of the first substrate, and for sealing the organic emission portion from external air; a first desiccant layer of a transparent material formed between the first and second substrates; a third substrate of an opaque material formed at another surface side of the first substrate, engaging with the second substrate, for sealing the first substrate; and a second desiccant layer of an opaque material formed between the first and third substrates.

According to a sixth aspect of the present invention, there is provided an organic light emitting display comprising: a first substrate; an organic emission portion formed at a surface of the first substrate; a second substrate of a transparent material formed at a surface side of the first substrate on which the organic emission portion is formed, an inward extended and bent edge thereof engaging with another surface of the first substrate, and for sealing the organic emission portion from external air; a first desiccant layer of a transparent material formed between the first and second substrates; a third substrate of a transparent material formed at another surface side of the first substrate, engaging with the second substrate, for sealing the first substrate; and a second desiccant layer of a transparent material formed between the first and third substrates.

The organic light emitting display according to embodiments of the present invention may efficiently intercept moisture entering the organic light emitting diode, which is susceptible to the moisture. Further, since a triple substrate is formed, the aspects of the present invention have an excellent impact resistance. Moreover, even though a double desiccant layer is formed, a dead space is reduced to obtain a great emission region of an organic light emitting display. In addition, when a third substrate is made of metal materials, additional metal bracket is not required.

BRIEF DESCRIPTION OF THE DRAWINGS

These and other aspects and advantages of the invention will become apparent and more readily appreciated from the following description of embodiments, taken in conjunction with the accompanying drawings of which.

DETAILED DESCRIPTION OF EMBODIMENTS

Figure 1:
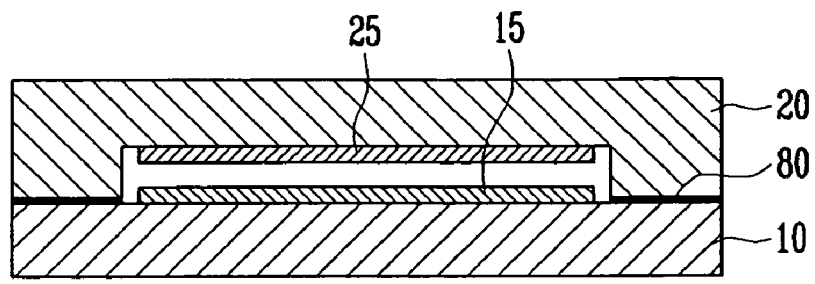
FIG. 1 is a cross-sectional view showing an organic light emitting display.

Hereinafter, some embodiments according to the present invention will be described with reference to the accompanying drawings. Here, when one element is connected to another element, one element may be not only directly connected to another element but also indirectly connected to another element via another element. Further, irrelative elements are omitted for clarity. Also, like reference numerals refer to like elements throughout.

Figure 2:
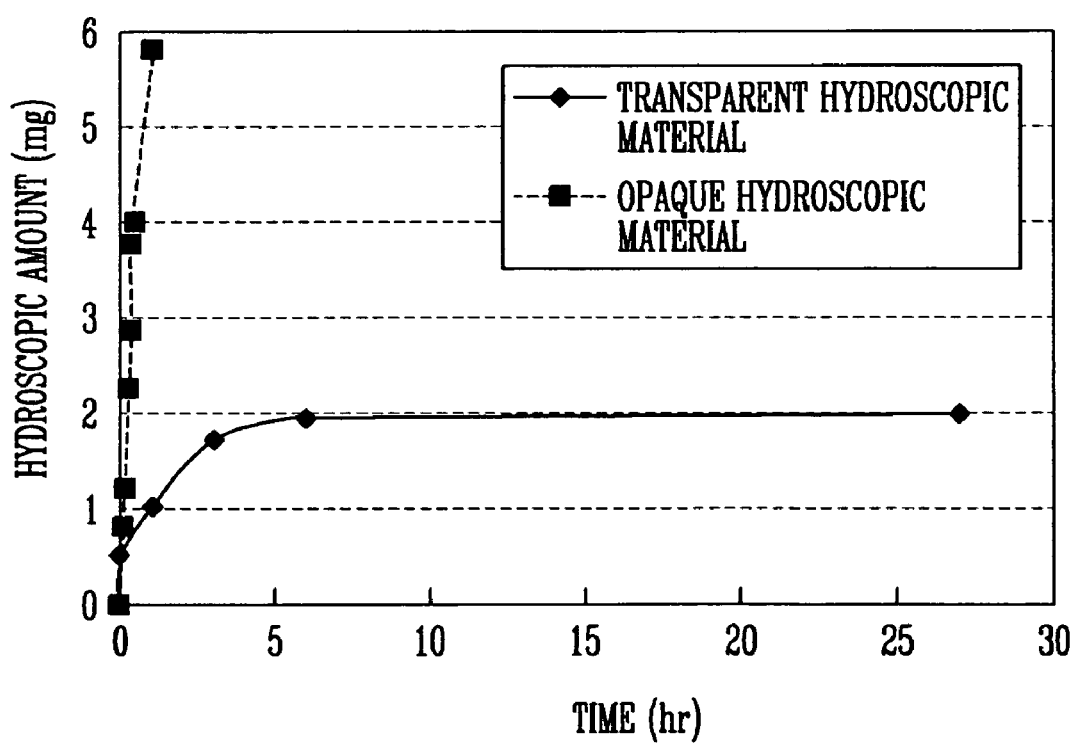
FIG. 2 is a graph showing a comparison of a desiccant amount of a transparent desiccant layer and a desiccant amount of an opaque layer.

FIG. 1 is a cross-sectional view showing an organic light emitting display. The organic light emitting display includes a first substrate 10, a desiccant or hydroscopic layer 25, and a second substrate 20. The first substrate 10 includes an organic emitting portion 15 at one surface thereof. The desiccant layer 25 protects the organic emitting portion 15 from external air, and absorbs penetrated moisture. The second substrate 20 engages with the first substrate 10 to face thereto. When the organic light emitting display emits light through the first substrate 10, the second substrate 20 should be made of transparent materials. Further, since the desiccant layer 25 attached to the first substrate 10 exists on a light emission surface, it should be also made of transparent materials. However, because a desiccant layer of a transparent material such as calcium oxide CaO has a lower hydroscopic ability than that of a desiccant layer of an opaque material, it cannot absorb moisture well. This is confirmed from FIG. 2, which is a graph showing a variation of hydroscopic amount in transparent and opaque layers according a time elapse.

Figure 3:
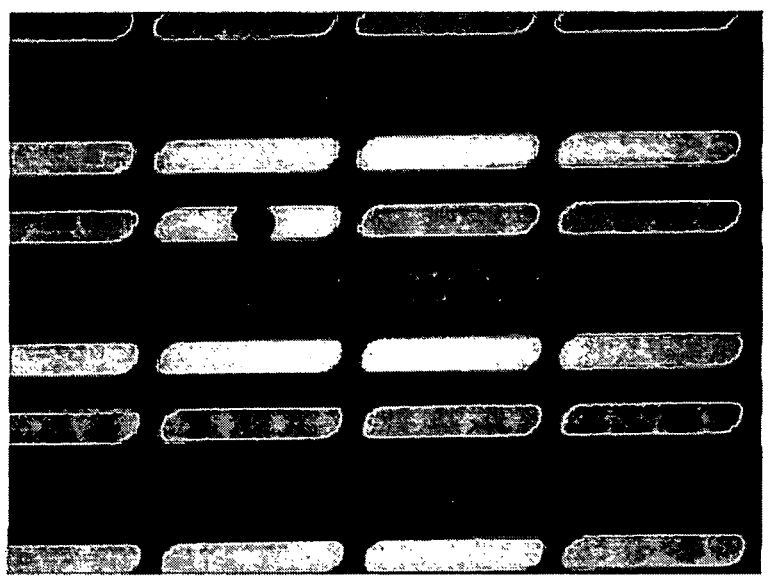
FIG. 3 is a view showing a disk spot occurring in a pixel of an organic light emitting diode.
Figure 4:
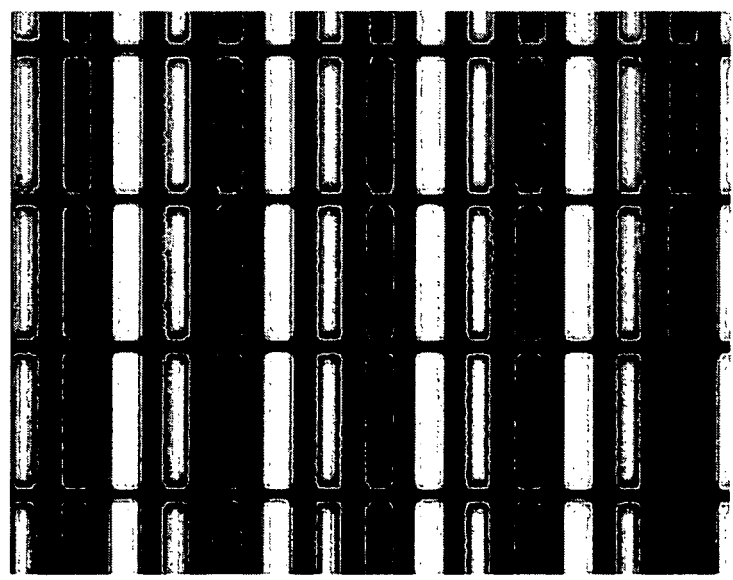
FIG. 4 is a view showing a pixel shrinkage occurring in a pixel of an organic light emitting diode.

When a moisture absorbing ability of the desiccant layer is deteriorated, an organic light emitting diode is degraded to have a dark spot or pixel shrinkage. FIG. 3 and FIG. 4 are views showing a disk spot and pixel shrinkage occurring in a pixel of an organic light emitting diode, respectively.

Figure 5:
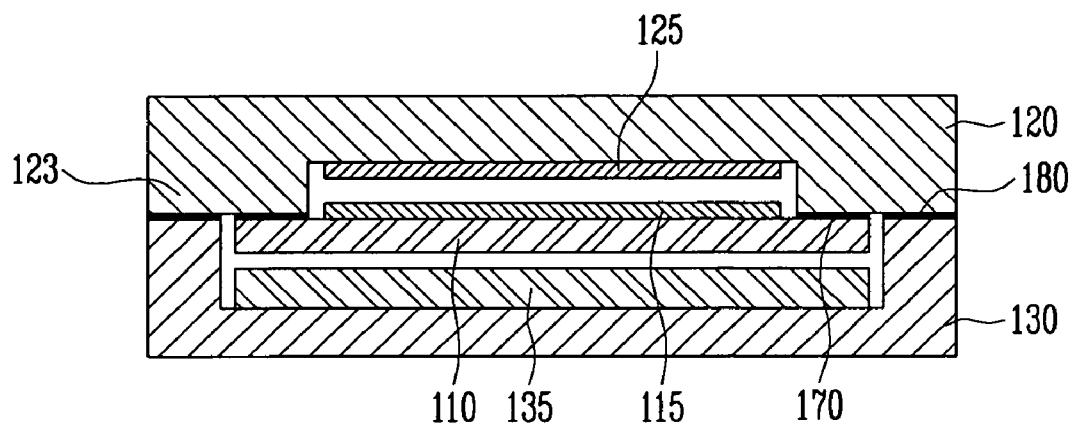
FIG. 5 is a cross-sectional view showing an organic light emitting display according to a first embodiment of the present invention.

An organic light emitting display according to a first embodiment of the present invention will be now explained with reference to FIG. 5. The organic light emitting display includes a first substrate 110, a second substrate 120, and a third substrate 130. The first substrate 110 includes an organic emission portion. An organic emission portion 115 is formed at the first substrate 110. Since the organic light emitting display is a top-emitting type, it does not emit light from a bottom side. The organic emission portion 115 includes two electrodes and an organic light emitting diode. The two electrodes face to each other. The organic light emitting diode is interposed between the two electrodes, and includes at least an organic emission layer. The organic light emitting diode can use a passive drive type or an active drive type. Materials and construction of the organic light emitting diode are not limited in the first embodiment of the present invention, and a detailed description thereof is omitted.

The second substrate 120 is a sealing substrate, which includes a first desiccant layer 125. A predetermined space is formed between the first substrate 110 and the second substrate 120. The second substrate 120 seals the first substrate 110 along an edge thereof, thereby keeping the organic emission portion 115 from external moisture. The space between the first substrate 110 and the second substrate 120 is formed in a nitrogen-rich state or filled with an inert gas such as argon to lower an oxygen level.

Because the double-sided organic light emitting display is a top-emitting type, a transparent material such as glass or transparent plastic materials may form it. Although the second substrate 120 is shown as a cap type in which an inside is etched (or both ends are bent), the present invention is not limited thereto. It would be appreciated by those skilled in the art that a plate type substrate can be used as the second substrate 120. In the first embodiment, the second substrate 120 is greater than the first substrate 110. The second substrate 120 includes an extension portion 123 extending to an outer side of the first substrate 110. The third substrate 130 to be described later engages with a lower surface of the extension portion 123. A seal or sealant is disposed at an engaging surface of the second substrate 120 with the first substrate 110, and prevent external moisture or oxygen from entering therein. The sealant 170 is made of organic or inorganic materials such as frit or epoxy. The seal may be considered to be more general than the sealant. The two terms was used interchangeably on occasions in this specification.

A space is formed between the first substrate 110 and the second substrate 120. The first desiccant layer 125 is formed at the space. The first desiccant layer 125 should be formed by transparent materials in a top-emitting structure. When the first desiccant layer 125 absorbs moisture, it is preferably made of a material that can maintain a transparent state. At least one selected from the group consisting of alkaline metal oxide, alkaline earth metal oxide, metal halide, metal sulfate, metal perchlorate, and metal phosphor pentoxide can be used in a form of a nanoscale porous film as the first desiccant layer 125.

The alkaline metal oxide may include lithium oxide $Li_2O$ sodium oxide $Na_2O$, or kalium oxide $K_2O$. The alkaline earth metal oxide may include barium oxide BaO, calcium oxide CaO, or magnesium oxide MgO. The metal halide may include calcium chloride $CaCl_2$, magnesium chloride $MgCl_2$, strontium chloride $SrCl_2$, yttrium chloride $YCl_2$, copper chloride $CuCl_2$, cesium fluoride CsF, tantalum fluoride $TaF_5$, niobium fluoride $NbF_5$, lithium bromide LiBr, calcium bromide $CaBr_3$, cerium bromide $CeBr_4$, selenium bromide $SeBr_2$, vanadium bromide $VBr_2$, magnesium bromide $MgBr_2$, barium iodide $BaI_2$, or magnesium iodide $MgI_2$. The metal sulfate may include lithium sulfate $Li_2SO_4$, sodium sulfate $Na_2SO_4$, calcium sulfate $CaSO_4$, magnesium sulfate $MgSO_4$, cobalt sulfate $CoSO_4$, gallium sulfate $Ga_2(SO_4)_3$, titanium sulfate $Ti(SO_4)_2$, or nickel sulfate $NiSO_2$. The metal perchlorate may include barium perchlorate $Ba(Cl_4O)_2$ or magnesium perchlorate $Mg(Cl_4O)_2$.

The third substrate 130 seals the first substrate 110 at an opposite direction of the second substrate 120. The third substrate 130 includes a third desiccant layer 135. The third substrate 130 is formed by transparent materials. The third desiccant layer 135 can be formed by transparent materials. On the other hand, when the third substrate 130 is formed by metal materials, it also functions as a bracket. Accordingly, an additional metal bracket to support a panel is not required. This is equally applicable the second, third, fourth, and fifth embodiments although a detailed description thereof is given.

The third substrate 130 is made of at least one selected from the group consisting of aluminum Al, iron Fe, copper Cu, chromium Cr, nickel Ni, and molybdenum Mo. Also, silicon, manganese, phosphor, sulfur, or carbon is included in the group. At least one selected from the group consisting of alkaline metal oxide, alkaline earth metal oxide, metal halide, metal sulfate, metal perchlorate, and metal phosphor pentoxide can be used as the transparent materials of the second desiccant layer 435. For example, at least one selected from the group consisting of barium oxide, calcium oxide, aluminum oxide, lithium sulfate, sodium sulfate, calcium sulfate, magnesium sulfate, cobalt sulfate, gallium sulfate, titanium sulfate, calcium chloride, or calcium nitrate may be used for the second desiccant layer 435. Since the second desiccant layer 435 has a good hydroscopic ability and a large quantity thereof can be located at a space between the first substrate 110 and the third substrate 130, it may efficiently prevent moisture from entering the organic light emitting diode.

In the embodiment, an edge of the third substrate 130 is bent and engages with a lower surface of the extension portion 123 of the second substrate 120. A sealant 180 is disposed at the engaged surface, and firstly prevents moisture from penetrating to an organic emission portion. The sealant 180 may be made of organic or inorganic materials such as frit or epoxy.

Embodiments of the present invention are applicable to a double-sided emission type organic light emitting display. The double-sided emission type organic light emitting display emits light from an organic emission layer toward both sides of above and below. In the embodiment shown in FIG. 5, the first and third substrates 110 and 130, the second desiccant layer 135 included in the third substrate 130 are made of transparent materials to efficiently prevent moisture from penetrating therein. Namely, although the second desiccant layer is formed by transparent materials, because the desiccant layers are disposed above and below, moisture can be efficiently intercepted.

Hereinafter, a method for fabricating an organic light emitting display according to the first embodiment of the present invention will be explained. A first substrate 100 is provided, a first electrode is formed on the first substrate 110, and an organic emission layer is formed on the first electrode. Here, the organic emission layer essentially includes an emission layer, and may include a hole relation layer such as a hole injection layer or a hole transport layer, and an electron relation layer such as an electron injection layer or an electron transport layer. A first electrode, a passivation film, and a planarization film are sequentially formed on the organic emission layer to obtain an organic emission portion 115.

On the other hand, a first desiccant layer 125 is formed at a surface of a second substrate 120 facing an organic emission layer of the first substrate 110. The second substrate 120 is adhered to the first substrate 110. Here, the second substrate 120 is adhered along an edge of the first substrate 110 to form a space between the first substrate 110 and the second substrate 120. A sealant 170 seals a contact part of the first substrate 110 and the second substrate 120.

The third substrate 130 is adhered to an extension portion of the second substrate 120 in an opposite surface of the second substrate 120. A second desiccant layer 135 is formed at the third substrate 130. The second desiccant layer 135 can be formed either by attaching a.hydroscopic film to a double-sided tape using a screen printing method or a sputtering method. The third substrate 130 is adhered along an extension portion 123 of the second substrate 120 to form a space between the second substrate 120 and the third substrate 130. A sealant 180 seals a contact part of the second substrate 120 and the third substrate 130.

Figure 6:
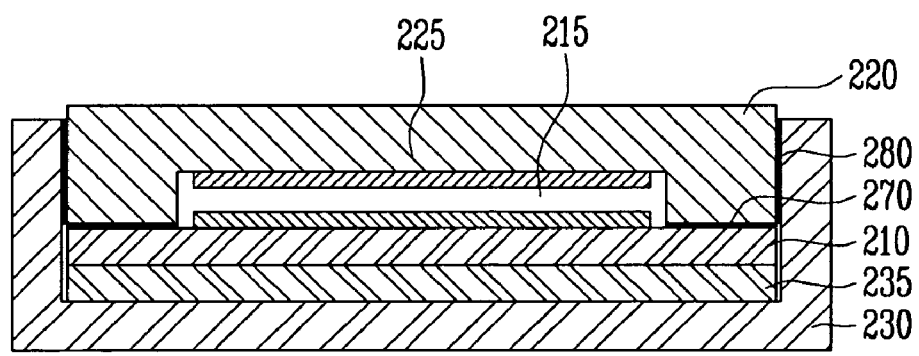
FIG. 6 is a cross-sectional view showing an organic light emitting display according to a second embodiment of the present invention.
Figure 7:
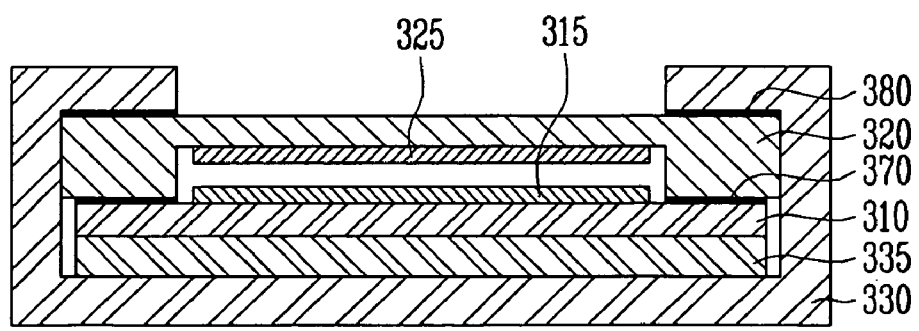
FIG. 7 is a cross-sectional view showing an organic light emitting display according to a third embodiment of the present invention.

Hereinafter, an organic light emitting display according to the second embodiment of the present invention will be described referring to FIG. 6. Since a first substrate 210, a first desiccant layer 225, and a second desiccant layer 235 in the second embodiment have structures similar to those of the first embodiment, a detailed description thereof is omitted.

The second embodiment has a similar construction to that of the first embodiment. However, the second embodiment has a characteristic in that an edge of the third substrate 230 is bent and engages with a side surface of the second substrate 220. In the second embodiment, the second substrate 220 has a similar area to that of the first substrate 210. The third substrate 230 is bent and extends upward to engage with a side surface of the second substrate 220. In this case, the first embodiment can provide a greater emission region for a size of a device in comparison with the first embodiment. An emission area among a total device area in the second embodiment is greater than that of the first embodiment, thereby reducing a dead space.

Figure 8:
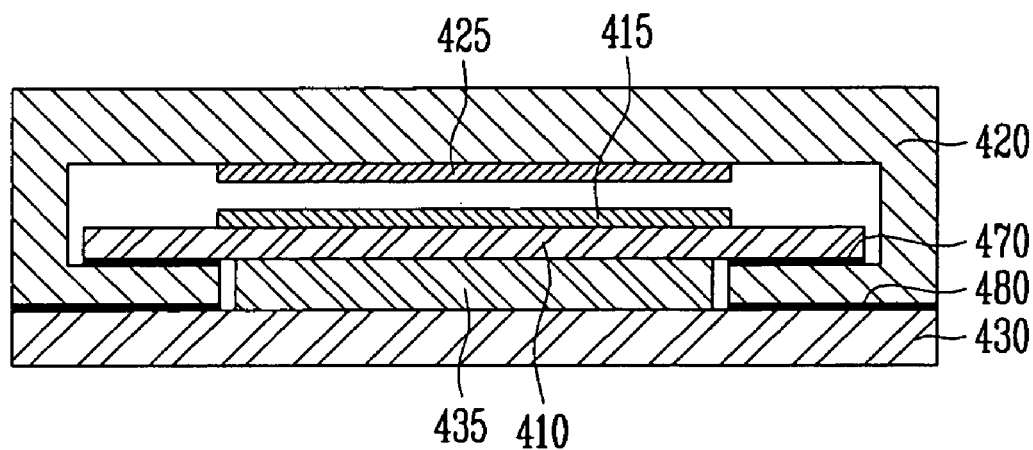
FIG. 8 is a cross-sectional view showing an organic light emitting display according to a fourth embodiment of the present invention.

Hereinafter, an organic light emitting display according to the third embodiment of the present invention will be explained referring to FIG. 8. Since a first substrate 310, a first desiccant layer 325, and a second desiccant layer 335 in the third embodiment has the same structures as those of the first embodiment, a detailed description thereof is omitted. The third embodiment has substantially the same construction as that of the first or second embodiment. The difference is that the third substrate 330 is bent twice and engages with a upper surface of the second substrate 320. Namely, in the third embodiment, the second substrate 320 has a similar area to that of the first substrate 310, the third substrate 330 is bent, extends upward, and is again bent to an inner side to engage with a upper surface of the second substrate 320. In this case, the third embodiment can embody a greater emission area for a size of a device in comparison with the first embodiment. That is, the third embodiment has an advantage in that an emission area occupied among an entire device area is greater than that of the first embodiment.

A fourth embodiment of the top-emitting organic light emitting display according to the present invention will be described with reference to FIG. 8. The organic light emitting display includes a first substrate 410, a second substrate 420, and a third substrate 430. The first substrate 410 includes an organic emission portion. The second substrate 420 includes a first desiccant layer 425. The third substrate 430 includes a second desiccant layer 435. An organic emission portion 415 is formed at the first substrate 410. Since the organic light emitting display is a top-emitting type, it does not emit light to a rear surface. The organic emission portion 415 includes a pair of electrodes and an organic light emitting diode. The pair of electrodes face to each other. The organic light emitting diode is. interposed between the electrodes and includes at least an organic emission layer. The organic light emitting diode can use a passive drive type or an active drive type. Materials and construction of the organic light emitting diode are not limited in the first embodiment of the present invention, and a detailed description thereof is omitted.

In the fourth embodiment, the second substrate 420 is a sealing substrate, which includes a first desiccant layer 425. A predetermined space is formed between the first substrate 410 and the second substrate 420. The second substrate 420 seals the first substrate 410 along an edge thereof, thereby keeping the organic emission portion 415 from external moisture. The space between the first substrate 410 and the second substrate 420 is formed in a nitrogen-rich state or filled with an inert gas such as argon to lower an oxygen level.

Because the organic light emitting display is a top-emitting type, it is formed by transparent materials such glass or transparent plastic materials. The second substrate 420 has a shape both ends of which are bent twice. Namely, the second substrate 420 encloses the first substrate 410. The second substrate 420 is disposed at one surface of the first substrate 410 in such a way that an extended and bent edge thereof engages with other surface of the first substrate 410. Here, a sealant 470 is disposed at an engaged surface of the first substrate 410 and the second substrate 420.

A space is formed between the first substrate 410 and the second substrate 420, and a first desiccant layer 425 is formed at the space. Under the top-emitting structure, the first desiccant layer 425 should be formed by transparent materials. The first desiccant layer 425 may maintain a transparent state when it absorbs moisture. At least one selected from the group consisting of alkaline metal oxide, alkaline earth metal oxide, metal halide, metal sulfate, metal perchlorate, and metal phosphor pentoxide can be used in a form of a porous film of a nano size as the first desiccant layer 425.

The alkaline metal oxide may include lithium oxide $Li_2O$ sodium oxide $Na_2O$, or kalium oxide $K_2O$. The alkaline earth metal oxide may include barium oxide BaO, calcium oxide CaO, or magnesium oxide MgO. The metal halide may include calcium chloride $CaCl_2$, magnesium chloride $MgCl_2$, strontium chloride $SrCl_2$, yttrium chloride $YCl_2$, copper chloride $CuCl_2$, cesium fluoride CsF, tantalum fluoride $TaF_5$, niobium fluoride $NbF_5$, lithium bromide LiBr, calcium bromide $CaBr_3$, cerium bromide $CeBr_4$, selenium bromide $SeBr_2$, vanadium bromide $VBr_2$, magnesium bromide $MgBr_2$, barium iodide $BaI_2$, or magnesium iodide $MgI_2$. The metal sulfate may include lithium sulfate $Li_2SO_4$, sodium sulfate $Na_2SO_4$, calcium sulfate $CaSO_4$, magnesium sulfate $MgSO_4$, cobalt sulfate $CoSO_4$, gallium sulfate $Ga_2(SO_4)_3$, titanium sulfate $Ti(SO_4)_2$, or nickel sulfate $NiSO_2$. The metal perchlorate may include barium perchlorate $Ba(Cl_4O)_2$ or magnesium perchlorate $Mg(Cl_4O)_2$.

The third substrate 430 seals the first substrate 410 at an opposite direction of the second substrate 420. A predetermined space is formed between the first substrate 410 and the third substrate 430, and the third substrate 430 engages with an end of the second substrate 420. A sealant 480 is disposed at a contacting surface of the third substrate 430 with an edge of the second substrate 420, and seals the first substrate 410 from an exterior. The third substrate 430 is formed by transparent materials in a top-emitting structure. However, there is not a limit thereto. As described earlier, when the third substrate 430 is formed by metal materials, it also functions as a bracket. The third substrate 130 is made of at least one selected from the group consisting of aluminum Al, iron Fe, copper Cu, chromium Cr, nickel Ni, and molybdenum Mo. Also, silicon, manganese, phosphor, sulfur, or carbon is included in the group. On the other hand, in the fourth embodiment, although the third substrate 430 is constructed as a plate type, it would be appreciated by those skilled in the art that the present invention is not limited thereto.

A second desiccant layer 435 is formed between the first substrate 410 and the third substrate 430, and can be made of transparent materials. At least one selected from the group consisting of alkaline metal oxide, alkaline earth metal oxide, metal halide, metal sulfate, metal perchlorate, and metal phosphor pentoxide can be used as the transparent materials of the second desiccant layer 435. For example, at least one selected from the group consisting of barium oxide, calcium oxide, aluminum oxide, lithium sulfate, sodium sulfate, calcium sulfate, magnesium sulfate, cobalt sulfate, gallium sulfate, titanium sulfate, calcium chloride, or calcium nitrate may be used for the second desiccant layer 435.

Since the second desiccant layer 435 has a good hydroscopic ability and a large quantity thereof can be located at a space between the first substrate 410 and the third substrate 430, it may efficiently prevent moisture from entering the organic light emitting diode. Further, as indicated above, since the third substrate 430 is formed by metals, an additional metal bracket is not required. Since the sealants 470 and 480 are positioned in an opposite direction of a light emission, a reduction of an emission area does not occur. Here, when the third substrate and the second desiccant layer are formed by transparent materials in the fourth embodiment, it would be appreciated that the transparent materials can be used in a double-sided emitting structure.

Figure 9:
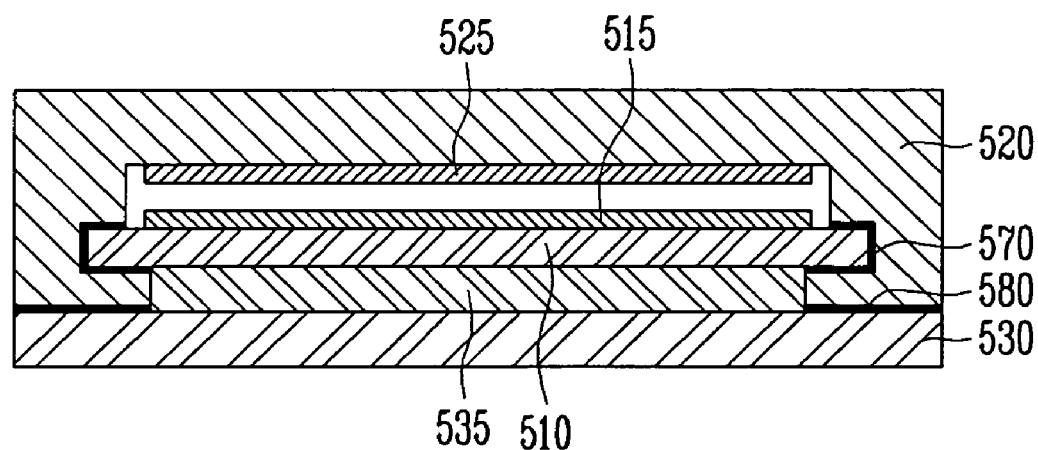
FIG. 9 is a cross-sectional view showing an organic light emitting display according to a fifth embodiment of the present invention.

A double-sided emitting type organic light emitting display according to a fifth embodiment of the present invention will be now explained referring to FIG. 9. The fifth embodiment has the similar construction to that of the fourth embodiment, but differs from that thereof with respect to a structure of a second substrate. The organic light emitting display includes a first substrate 510, a second substrate 520, and a third substrate 530. The first substrate 510 includes an organic emission portion. The second substrate 520 includes a first desiccant layer 525. The third substrate 530 includes a second desiccant layer 535. An organic emission portion 515 is formed at the first substrate 510. Since the double-sided emitting type organic light emitting display is a double-sided emitting type, the first substrate 510 is formed by transparent materials. The organic emission portion 515 includes a pair of electrodes and an organic light emitting diode. The pair of electrodes face to each other. The organic light emitting diode is interposed between the electrodes and includes at least an organic emission layer. The organic light emitting diode can use a passive drive type or an active drive type. Materials and construction of the organic light emitting diode are not limited in the first embodiment of the present invention, and a detailed description thereof is omitted.

In the fifth embodiment, the second substrate 520 is a sealing substrate, which includes a first desiccant layer 525. A predetermined space is formed between the first substrate 510 and the second substrate 520. The second substrate 520 seals the first substrate 510 along an edge thereof, thereby keeping the organic emission portion 515 from external moisture. The space between the first substrate 510 and the second substrate 520 is formed in a nitrogen-rich state or filled with an inert gas such as argon to lower an oxygen level.

Because the second substrate 520 is a double-sided emitting type, it is formed by transparent materials such glass or transparent plastic materials. The second substrate 520 has a shape with a groove in which the first substrate 510 is inserted. That is, the second substrate 520 has a groove in which an end of the first substrate 510 is inserted. The second substrate 520 is positioned at one surface of the first substrate 510, and an extended and bent end thereof engages with other surface of the first substrate 510.

A space is formed between the first substrate 510 and the second substrate 520, and a first desiccant layer 515 is formed at the space. Under the double-sided emitting structure, the first desiccant layer 515 should be formed by transparent materials. The materials as described in the first embodiment can be used as the transparent materials.

The third substrate 530 seals the first substrate 510 at an opposite direction of the second substrate 520. A predetermined space is formed between the first substrate 510 and the third substrate 530, and the third substrate 530 engages with an end of the second substrate 520. A sealant 580 is disposed at a contacting surface of the third substrate 530 with an end of the second substrate 520, and seals the first substrate 510 from an exterior. Although the third substrate 530 is formed by transparent materials in order to embody a double-sided emitting structure, there is not a limit thereto. For example, glasses or transparent polymers can be used as the transparent materials. On the other hand, the third substrate 530 is constructed in a plate type. However, it would be appreciated by those skilled in the art that a cap type can be used as the third substrate 530.

A second desiccant layer 535 is disposed between the first substrate 510 and the third substrate 530. The third substrate 530 is formed by transparent materials in a double-sided emitting structure, and the second desiccant layer 535 formed on the third substrate 530 should be also made of transparent materials. Transparent materials for the first desiccant layer may be used as those of the second desiccant layer 535.

Although the second desiccant layer 535 is formed by transparent materials, it is disposed between the first substrate 510 and the third substrate 530 to efficiently prevent moisture from entering the organic light emitting diode. Further, the sealants 570 and 580 are positioned to overlay with each other not to reduce an emission region.

Although various embodiments of the present invention have been shown and described, it would be appreciated by those skilled in the art that changes might be made in this embodiment without departing from the principles and spirit of the invention, the scope of which is defined in the claims and their equivalents. For example, the third substrate can be adhered to the first or second substrate in various shapes. Further, a kind of desiccant layers formed in the first, second, or third substrate can be variously changed.

What is claimed is:

1. An organic light emitting display device, comprising:
   a first substrate;
   a second substrate;
   a third substrate, wherein the first substrate is interposed between the second and third substrates;
   an array of organic light emitting pixels, the array being interposed between the first substrate and the second substrate;
   a first seal interconnecting the first and second substrates, wherein the first substrate, the second substrate and the first seal in combination define a first enclosed space where the array is located; and
   a second seal connecting the third substrate to at least one of the first and second substrates, wherein the second substrate, the third substrate and the second seal in combination define a second enclosed space;
   wherein the third substrate comprises a center portion substantially opposing the first substrate and a peripheral portion surrounding the center portion, wherein the peripheral portion is integrated with the center portion and extends generally in a direction toward the second substrate.

2. The device of claim 1, wherein the second substrate comprises a surface substantially parallel to the first substrate, and wherein the third substrate comprises a surface substantially parallel to the first substrate.

3. The device of claim 1, wherein the second substrate comprises a center portion substantially opposing the first substrate and a peripheral portion surrounding the center portion, wherein the peripheral portion of the second substrate comprises a first sealing surface, and wherein the first seal is formed between the first sealing surface and the first substrate.

4. The device of claim 3, wherein the peripheral portion of the second substrate further comprises a second sealing surface, and wherein the second seal is formed between the second sealing surface and the third substrate.

5. The device of claim 4, wherein the first and second sealing surfaces are generally parallel or generally perpendicular to each other.

6. The device of claim 4, and wherein the first and second sealing surfaces are generally in a single plane.

7. The device of claim 3, wherein the first substrate comprises a sealing surface, and wherein the first seal is formed between the first sealing surface of the second substrate and the sealing surface of the first substrate.

8. The device of claim 1, wherein the second substrate comprises a center portion and a peripheral portion surrounding the center portion, wherein the center portion comprises an inner surface facing the first substrate, and wherein the inner surface is recessed with reference to the first sealing surface of the peripheral portion.

9. The device of Claim 4, wherein the peripheral portion of the third substrate comprises a sealing surface, and wherein the second seal interconnects the sealing surface of the third substrate and the second sealing surface of the second substrate.

10. The device of claim 9, wherein the second substrate comprises an second sealing surface generally facing away from the first substrate, wherein the third substrate further comprises a flange extending from the peripheral portion of the third substrate, and wherein the flange comprises the sealing surface of the third substrate.

11. The device of claim 10, wherein the flange surrounds the first substrate at least part of the second substrate, wherein the flange comprises an inner surface facing the first substrate and the at least part of the second substrate, and wherein the inner surface comprises the sealing surface of the third substrate.

12. The device of claim 11, wherein the second sealing surface of the second substrate faces the inner surface of the flange.

13. The device of claim 3, wherein the second substrate further comprises a flange extending from the peripheral portion of the second substrate, and wherein the flange comprises a second sealing surface generally facing the third substrate.

14. The device of claim 1, further comprising a desiccant layer within the first enclosed space, wherein the desiccant layer is substantially transparent with regard to visible light.

15. The device of claim 14, wherein the desiccant layer is interposed between the first substrate and the center portion of the second substrate.

16. The device of claim 1, further comprising a desiccant layer within the second enclosed space, wherein the desiccant layer is opaque with regard to visible light.

17. The device of claim 16, wherein the desiccant layer contacts at least one of the first and third substrates.

18. The device of claim 1, wherein at least part of the third substrate is made of a material selected from the group consisting of glass, a polymeric resin and a metal.

* * * * *